United States Patent [19]

Sutcliffe et al.

[11] 4,407,062

[45] Oct. 4, 1983

[54] METHODS OF PRODUCING SUPERCONDUCTORS

[75] Inventors: Gordon R. Sutcliffe, Millbank; Stephen J. Warden, Erdington; Donald Humpherson, Great Barr, all of England

[73] Assignee: Imi Kynoch Limited, Birmingham, United Kingdom

[21] Appl. No.: 276,994

[22] Filed: Jun. 24, 1981

[30] Foreign Application Priority Data

Jul. 15, 1980 [GB] United Kingdom ............... 8023113
Feb. 18, 1981 [GB] United Kingdom ............... 8105136

[51] Int. Cl.³ .............................................. B05D 5/12
[52] U.S. Cl. .................................... 29/599; 29/605; 427/62; 427/120
[58] Field of Search ............ 427/120, 62, 376.4; 29/599, 605

[56] References Cited

U.S. PATENT DOCUMENTS

| 3,298,860 | 1/1967 | Bryant et al. | 427/376.4 |
| 3,352,009 | 11/1967 | Cohn et al. | 427/120 |
| 3,528,172 | 9/1970 | Smulkowski | 427/62 |
| 3,733,692 | 5/1973 | Fietz et al. | 29/599 |
| 3,807,041 | 4/1974 | McDougall | 29/599 |
| 4,040,173 | 9/1977 | McDougall | 29/599 |

FOREIGN PATENT DOCUMENTS

| 488765 | 12/1952 | Canada | 427/120 |
| 1028182 | 5/1966 | United Kingdom . | |
| 1084517 | 9/1967 | United Kingdom . | |
| 1269252 | 4/1970 | United Kingdom . | |
| 1387941 | 3/1975 | United Kingdom . | |
| 1413795 | 11/1975 | United Kingdom . | |
| 1576416 | 8/1980 | United Kingdom . | |

OTHER PUBLICATIONS

Kingery, "Introduction to Ceramics", John Wiley & Sons, N.Y., pp. 51–54 (1960).
Singer et al., "Industrial Ceramics", Chapman & Hall, London (1963) pp. 152–154, 32, 50–51.

Primary Examiner—Norman Morgenstern
Assistant Examiner—Richard Bueker
Attorney, Agent, or Firm—Cushman, Darby & Cushman

[57] ABSTRACT

A method of coating products such as metallic coil formers and wire containing the components of an intermetallic superconductive compound in which the coating is flexible at room temperatures but which has good insulating properties after heat treatment, the coating comprising a mixture of sodium silicate, chalk and China clay which reacts on heat treatment to form an insulating ceramic but which is flexible when merely dried.

8 Claims, 3 Drawing Figures

METHODS OF PRODUCING SUPERCONDUCTORS

BACKGROUND OF THE INVENTION

This invention relates to superconductors and methods of manufacture thereof. It has particular reference to the insulation of superconductive wire. The standard method of manufacturing multi-filamentary intermetallic superconducting wires now comprises the steps of producing a precursor wire comprising filaments of one of the elements of the intermetallic compound embedded in a matrix of a carrier metal, usually copper, and the remaining components of the intermetallic compound. As intermetallic compounds are extremely brittle it is necessary to fabricate the precursor wire to its final diameter before heating the precursor wire to react the components of the intermetallic compound to form the superconducting filaments.

There are two main ways of producing wires from superconducting wire having intermetallic filaments therein. The first method is to react the wire first and then to wind the magnet from the reacted wire. Such a method is known as a react and wind (RAW) method.

The second method of manufacturing magnets is to wind the magnets with green or unreacted wire and to react the wire subsequent to the winding operation. Such a method is known as wind and react or WAR.

In British Pat. No. 1,413,795 there is described and claimed a method of insulating intermetallic superconductive wire which is particularly applicable to the RAW route. The method therein described basically entails the use of a stop weld to prevent the adjacent turns of a spool of wire from becoming welded together during the reaction stage. Because of the great lengths of wire which are reacted at any one time it is necessary to wind the wire onto a spool for insertion into a suitable furnace during the reaction. Thus, in the aforementioned British Pat. No. 1,413,795 there is described the use of a stop weld which comprises either carbon or magnesium oxide which can be brushed off of the wire after the reaction stage.

There is also proposed the production of an electromagnetic coil in a single operation by winding the coated precursor into a coil and reacting it with the insulant staying in position to prevent welding between the turns and also to act as an electrical insulator. It is stated that such a method is only usable where the stop weld is also an electrical insulator. The specification then goes on to state that the coil is then impregnated to hold the turns in position.

Although the methods described and claimed in British Pat. No. 1,413,795 are eminently suitable for the RAW route, it has so far not been possible to produce superconductor coils by the WAR route using the methods described in the aforementioned British patent specification. The reason for this is that there has to date been no known coating which is both flexible after coating and drying and yet insulating in the heat treated state.

The present invention provides in one embodiment thereof an insulant for superconducting wires which is flexible in the coated and dried state but which is insulating in the reacted or heat treated state.

SUMMARY OF THE INVENTION

By the present invention there is provided a method of insulating a product which comprises the steps of providing a coating on the product with a mixture of a silicate of a metal chosen from the group sodium, lithium, and potassium and a second component capable of reacting with the said silicate to form a ceramic, drying the coating and heating the coating to a temperature in excess of 500° C. to react the said silicate and the second component to form the insulating ceramic. The silicate is preferably sodium silicate.

The second component may be chosen from the group including alumina or a compound containing aluminium or magnesium. The second component may be China clay. The ceramic may be an alumino silicate. The proportions of the second component to sodium silicate may be in the range of 1:1.5 to 1:1.75, preferably 1:1.65.

There may be provided a compound of calcium in the second component. Preferably the calcium may be present as calcium carbonate (chalk).

The product may be an intermetallic conductor precursor wire or a metal coil former.

The wire may be dried after the coating and before heating to form the ceramic. The dried wire may be wound around a former prior to heating to form the ceramic.

The wire may be heated at the same time as forming the ceramic or after the ceramic has been formed to react the components of the intermetallic superconductive compound to form the superconductive material. The sodium silicate, obtained commercially in the form of a solution, in water has the second component of the ceramic added to it to form a dispersion and this mixture is then applied to the wire and subsequently dried.

The coating may be coloured to colour code the wires and to enable any defects in the coating to be readily seen against the background of the wire or other product itself. Suitable colouring materials are water soluble dyes such as cresol red, bromophenol blue, thymol blue or tartrazine which may be present in amounts in the range of 0.05 g/l to 0.2 g/l.

The present invention further provides a wire treated in accordance with the methods outlined above.

The present invention yet further provides a magnet comprising an intermetallic superconductive compound in filamentary form located in a wire, the wire being wound around a former, and adjacent strands of the wire being electrically insulated one from the other by means of an insulating ceramic formed in situ, by a reaction between a silicate of a metal chosen from the group sodium or potassium and a second component capable of reacting with said silicate to form the ceramic. Additionally the former may be insulated from the windings with the same insulating medium. The second component may be a silicate of calcium magnesium or aluminium such as talc or China clay. A carbonate of calcium or magnesium may also be provided to react to form the ceramic.

BRIEF DESCRIPTION OF THE DRAWINGS

By way of example embodiments of the present invention will now be described with reference to the accompanying drawings, of which.

DESCRIPTION OF THE PREFERRED EMBODIMENTS

In British Patent Specification No. 1,413,795 referred to above there is described a method of coating wire comprising using a mixture of lanolin and alumino silicate. The lanolin is said to decompose to form a carbon layer which is removed by oxidation prior to impregnation. The processes described in the prior art specification do not provide flexible coatings which can be bent at room temperature without cracking and flaking. Extensive efforts have been made heretofor to provide such a coating and most of the times heretofor formed coatings which were either insufficiently ductile at low temperatures or which were not insulating after treatment at high temperatures. Some of the coatings were found to be uneven and suffered from a phenomenon known as crawling in which the coating cracked into small balls or globules on the wires during the heat treatment.

It has now been discovered that mixtures of sodium silicate and China clay when formed into a mixture or dispersion with water can be coated onto wires and dried to form a flexible coating. These wires can then be wound around a suitable former to form an electromagnet and heated to convert the coating to a ceramic. Further heating of the wires is necessary to transform the precursor wires into intermetallic superconductive wires.

Figure 1:
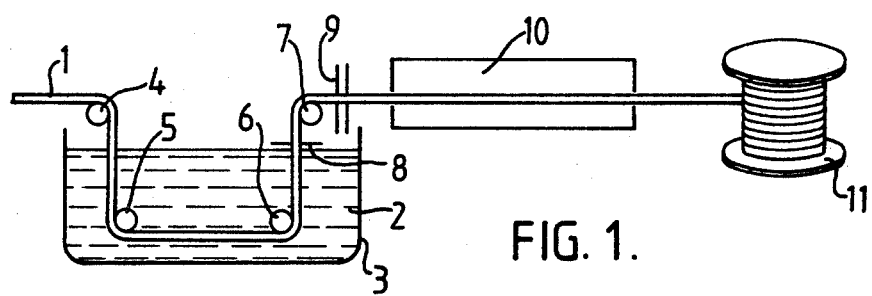
FIG. 1 is a schematic view of a coating line coating wire in accordance with the present invention.

Referring to FIG. 1 this shows a wire, it being coated by being passed through a dispersion 2 located in a containing vessel 3. The wire is passed over a series of pulleys 4, 5, 6 and 7 and also passes through a series of thickness control devices 8 and 9 to remove excess quantities of coating. The wire is then dried by passing through a drying oven 10 and is spooled onto a suitable spool 11. The dispersion 2 comprises a mixture of sodium silicate, China clay and chalk in water and typically the composition of the dispersion would be
200 ml of sodium silicate specific gravity 1.5
15 ml of water
40 g China clay
40 g chalk The wire is passed through the dispersion at room temperature and is dried in the drying oven 10 at a temperature of 120° C., higher temperatures may be used depending on the length of the oven and the rate of traverse of the wire through the oven. Typically, a coating of approximately 50 microns thickness is applied to the wire, which has a starting diameter of 0.7 mm, in three coating passes with each layer being dried before the subsequent layer is applied.

Figure 2:
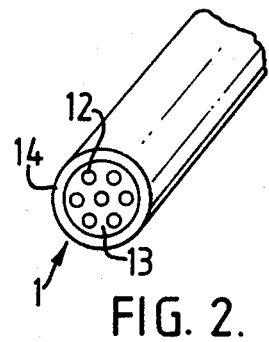
FIG. 2 is a perspective view of a coating wire.

Referring to FIG. 2 this shows the wire, indicated generally by 1, and which comprises a series of niobium filaments 12 embedded in a bronze matrix 13. The bronze would typically comprise a copper plus 7 to 15 wt% tin alloy. The wire, which is a precursor to a superconductive wire, is coated with a layer 14 of the mixture of sodium silicate, chalk and China clay and dried. The wire can then be handled and wound around a magnet former, a spool or other mandrel. On heating the wire to a temperature preferably in the range of 650° C. to 800° C. a reaction between the sodium silicate, the chalk and the China clay occurs to form a ceramic. The reaction between the sodium silicate, the chalk and the China clay does not require the presence of any external agent and thus the reaction can take place in a vacuum or, if required, in argon or other inert gas.

After the coating has been converted to the ceramic, extended heat treatment of the wires on their formers may be required to convert the niobium filaments to $Nb_3Sn$ by the solid state diffusion of tin from the bronze into the niobium filaments. Such a reaction is well known and it is clear that other intermetallic compounds such as $V_3Ga$ could be formed by the use of suitable starting stock materials.

Figure 3:
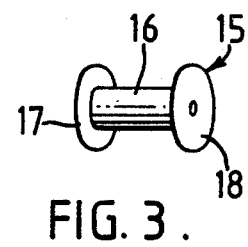
FIG. 3 is a perspective view of a metal coil former.

Referring to FIG. 3 there is shown a metal coil former 15 which has a central tubular portion 16 and end flanges 17, 18. To insulate the metal former the former can be coated with a mixture of sodium silicate, chalk and China clay as described above. Again the former can be heated to temperatures in the range 650°-800° C. to cause a reaction between the sodium silicate, the chalk and the China clay to form a ceramic.

Although there is described herein the use of sodium silicate as one of the components of the ceramic, other materials, such as potassium silicate, could be used. Furthermore, instead of China clay materials such as a silicate of calcium or magnesium could be substituted, alternatively other materials capable of forming a ceramic with sodium silicate can be used.

The coatings described immediately above with reference to FIGS. 1 and 2 are, when heat treated, translucent. To enhance visibility of the coatings to enable a visual check for defects to be made the coatings can be coloured by the addition of 0.1 g/l of a suitable dye such as cresol red. Alternative dyes may be used to colour code the wires for such parameters as wire diameter filament numbers etc.

The main method presently used to insulate superconductive wire prior to winding and reacting is to provide a glass braid around the wire. The glass braid is knitted to form a tube surrounding the wire. Presently the main type of glass suitable for such a braid is known as E glass. Such a glass can be formed into filaments sufficiently fine for knitting purposes but unfortunately can only withstand temperatures up to 710° C. This limits the maximum temperature at which the superconductive precursor can be heated for reaction purposes. Clearly as reactions to form the superconductive compound within the superconductor precursor are temperature-dependent the use of higher temperatures enables the time of reaction to be reduced. Thus, if a reaction temperature of 710° C. is used, a reaction time might be 168 hours. By comparison, if a reaction temperature of 775° C. were used the time could be reduced to 72 hours. This would mean that for a given furnace the throughput could be twice as high or alternatively that only half the size of furnace would be needed for a given amount of reaction material to be formed. Furthermore the glass braid has a relatively high volume and the insulant therefore occupies a substantial proportion of the coil being wound. Using the coating of the present invention enables more turns of wire to be used per equivalent volume and thus reduces the size of the magnet needed to obtain a good field.

Conventionally glass braided material is impregnated with epoxy resin after reaction to fill the small voids existing between the layers of the glass braid. It would be possible to use the coating of the present invention to fill the voids in the glass braid and the superconductor precursor would then be covered with a glass braid impregnated with the coating and wound in the wet state prior to drying and reaction.

The wire, when covered with a coating which has not been fired, is very flexible. To test this point a 0.9 mm diameter wire was coated in two steps to a thickness of 0.04 mm with the coating referred to above. The coated wire was then bent round three mandrels having diameters of 5, 20 and 40 mm. The wire was removed from each of the mandrels and straightened and then rewound round the mandrels. It was found that the wire failed after two reversals on a 5 mm mandrel, 9 reversals on a 20 mm mandrel and 24 reversals on a 40 mm mandrel. It can be seen, therefore, that the coating is both adherent and flexible. It has been found that after firing the breadkdown voltage is greater than that of glass braid. The coating may also be applied more rapidly than glass braid. Because glass braiding is a slow knitting process, whereas application of the coating is a continuous dipping type process, the coating may be applied at speeds eight times greater than glass braid. Also the cost of materials is less than that for glass braiding.

A further advantage of the coating of the present invention over the prior art glass braiding is that it is relatively easy to remove the coating before firing. It can simply be removed by dipping in hot water and wiping. By comparison glass braiding, once applied, is difficult to remove. Clearly after firing, however, the coating is very difficult to remove because it has formed an adherent ceramic which can withstand temperatures of up to 1050° C. It could be appreciated, therefore, that there are numerous advantages of the invention over the prior art method of coating superconductive wires used for the wind and react route.

We claim:

1. A method of insulating an intermetallic compound superconducting wire product which comprises the steps of coating an intermetallic superconductor wire precursor with a coating from an aqueous mixture consisting essentially of sodium silicate, China clay and calcium carbonate, drying the coated wire precursor after coating and winding the dried wire precursor around a former, heating the wire and former to form an insulating ceramic from the coating and reacting the components of the intermetallic compound in the precursor to form the intermetallic superconducting compound in the wire.

2. A metod as claimed in claim 1 in which the ratio of sodium silicate to the combination of China clay and calcium carbonate is in the range 1.5:1 to 1.75:1.

3. A method as claimed in claim 2 in which the ratio is 1.65:1.

4. A method as claimed in claim 1 in which the calcium carbonate and China clay are present in substantially equal amounts.

5. A method as claimed in claim 1 in which the mixture further includes a coloring compound.

6. A method as claimed in claim 5 in which the coloring compound is a water soluble die.

7. A method as claimed in claim 6 in which the die is selected from the group consisting of cresol red, bromophenol blue, thymol blue or tartrazine, preferably present in amounts in the range 0.05 g/l to 0.2 g/l.

8. A method as claimed in claim 1 in which the dried wire is heated at the same time as forming the ceramic or after the ceramic has been formed to react the components of the intermetallic superconductive compound to form the superconductive material.

* * * * *